United States Patent [19]

Slagel et al.

[11] 4,327,953
[45] * May 4, 1982

[54] INTERCHANGEABLE MODULE FOR INTEGRATED CIRCUITS

[75] Inventors: Gary A. Slagel, Richardson; Peter L. Bonfield, Dallas, both of Tex.

[73] Assignee: Texas Instruments Incorporated, Dallas, Tex.

[*] Notice: The portion of the term of this patent subsequent to Aug. 12, 1997, has been disclaimed.

[21] Appl. No.: 103,830

[22] Filed: Aug. 2, 1979

Related U.S. Application Data

[63] Continuation of Ser. No. 803,507, Jun. 6, 1977, Pat. No. 4,216,522.

[51] Int. Cl.³ .............................................. H01R 23/72
[52] U.S. Cl. ............................ 339/17 CF; 174/52 FP; 339/75 MP
[58] Field of Search ............... 339/17 CF, 17 R, 17 C, 339/39, 75 R, 75 MP, 75 M, 75 P, 174; 174/52 FP; 361/390, 391, 392, 394, 395, 399, 403; 364/708

[56] References Cited

U.S. PATENT DOCUMENTS

| | | |
|---|---|---|
| 1,970,968 | 8/1934 | McCloy et al. ................... 339/63 R |
| 3,317,879 | 5/1967 | Smith .............................. 339/75 MP |
| 3,662,230 | 5/1972 | Redwantz ....................... 174/52 FP |
| 3,912,983 | 10/1975 | Lowry, Jr. ......................... 361/403 |
| 4,089,575 | 5/1978 | Grabbe .......................... 339/17 CF |
| 4,216,522 | 8/1980 | Slagel et al. ................... 339/17 CF |

FOREIGN PATENT DOCUMENTS 863366  1/1953  Fed. Rep. of Germany .... 339/75 P

Primary Examiner—Neil Abrams
Attorney, Agent, or Firm—Robert D. Marshall, Jr.; Leo N. Heiting; Melvin Sharp

[57] ABSTRACT

A module containing an integrated circuit is disclosed. The module may be repetitively installed in a receptacle located in some electronic apparatus, such as an electronic calculator or video game, with low risk of damage to the integrated circuit or to the receptacle. The module is essentially "box" shaped and is provided with keys and slots for assuring proper orientation within the receptacle. The integrated circuit device is preferably attached via its leads to a substrate located in a chamber located within the module. Contacts are affixed to the substrate and coupled to the leads. These contacts are accessible from the exterior of the module through at least one aperture provided from the exterior to the chamber.

2 Claims, 13 Drawing Figures

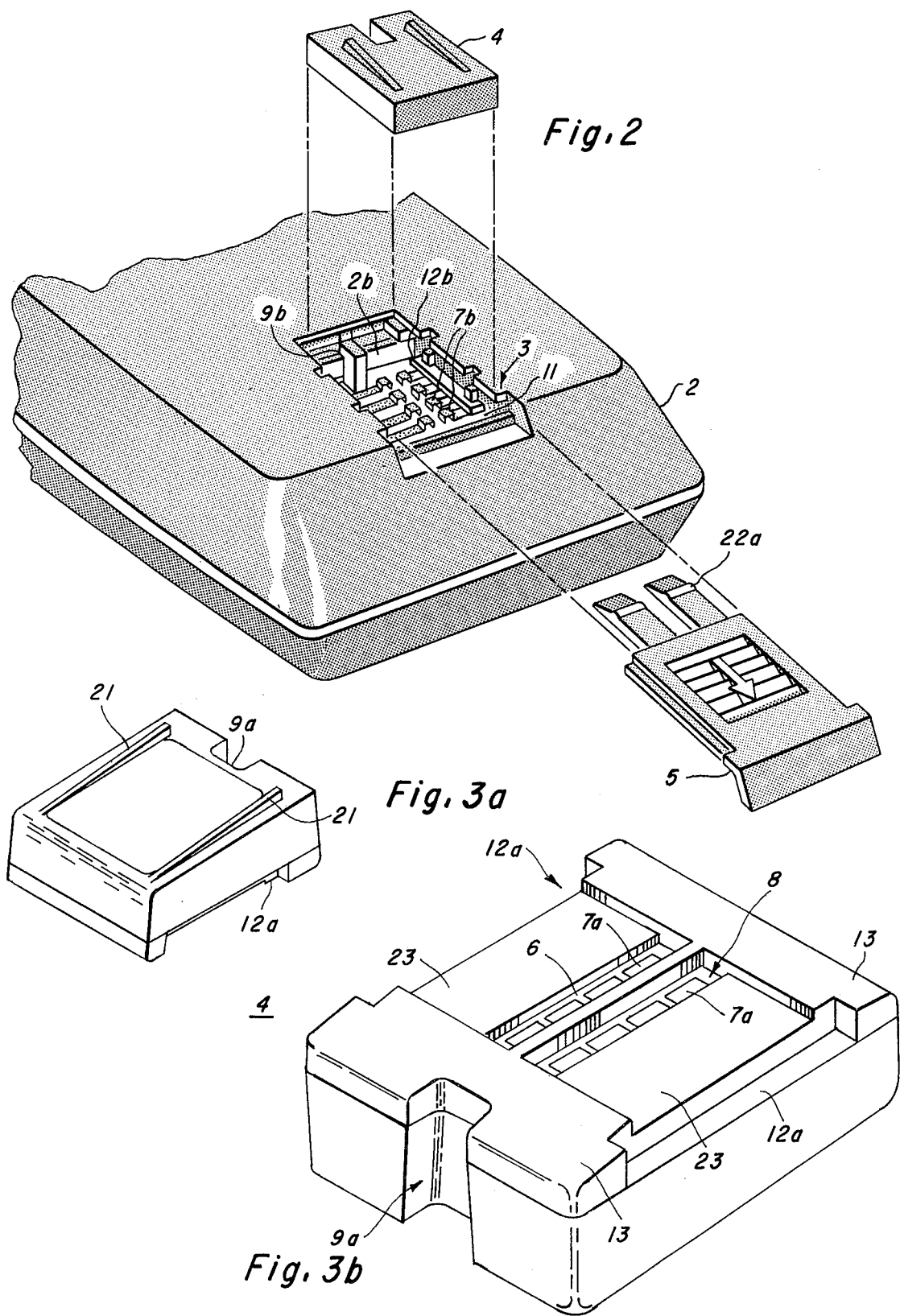

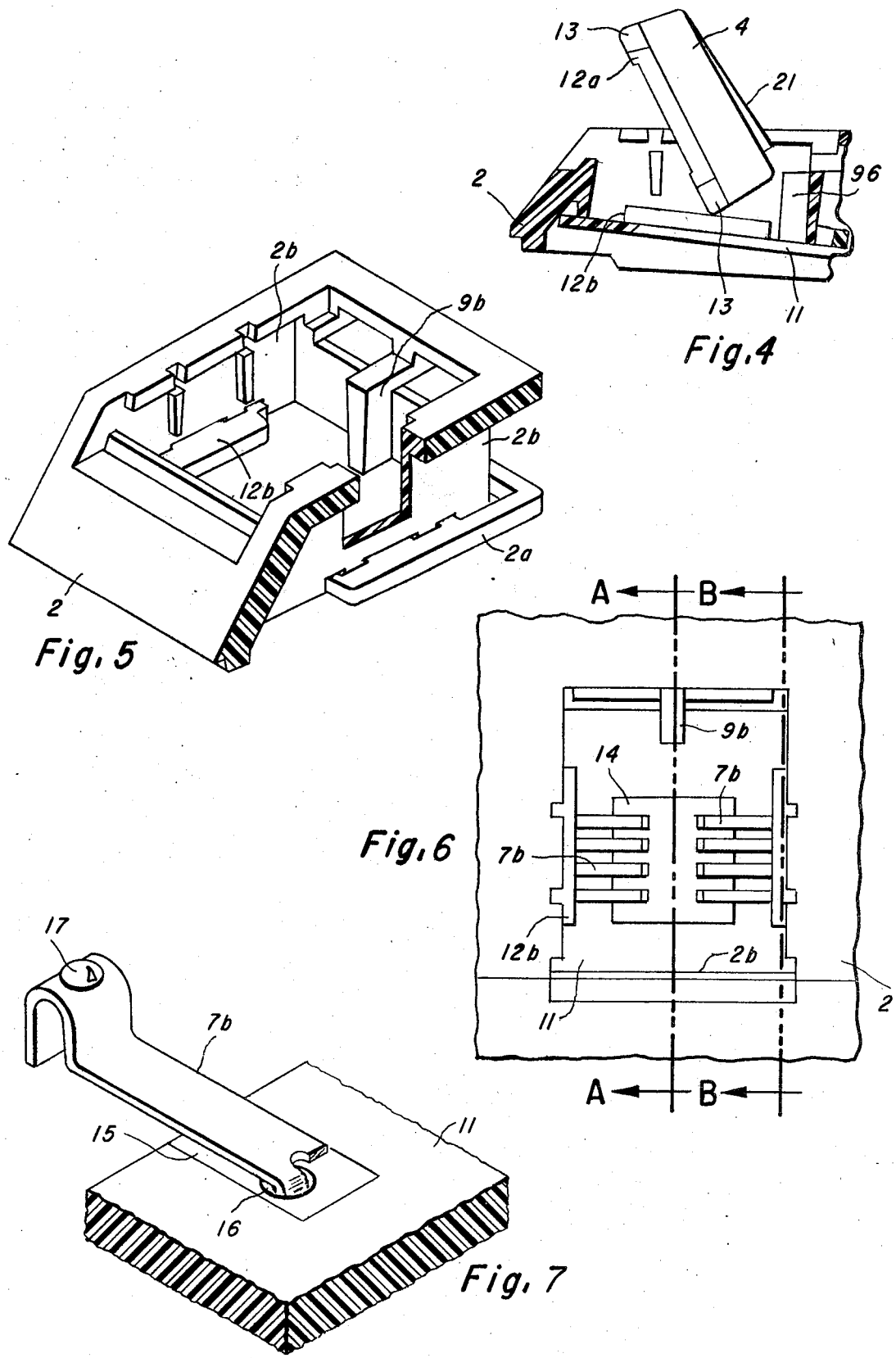

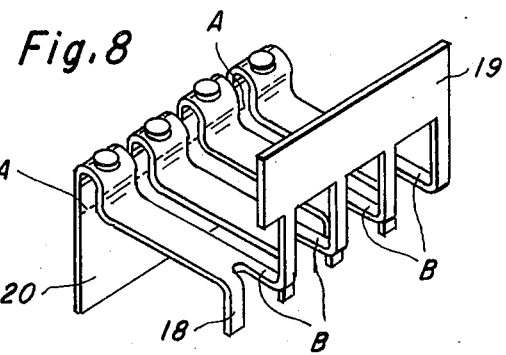
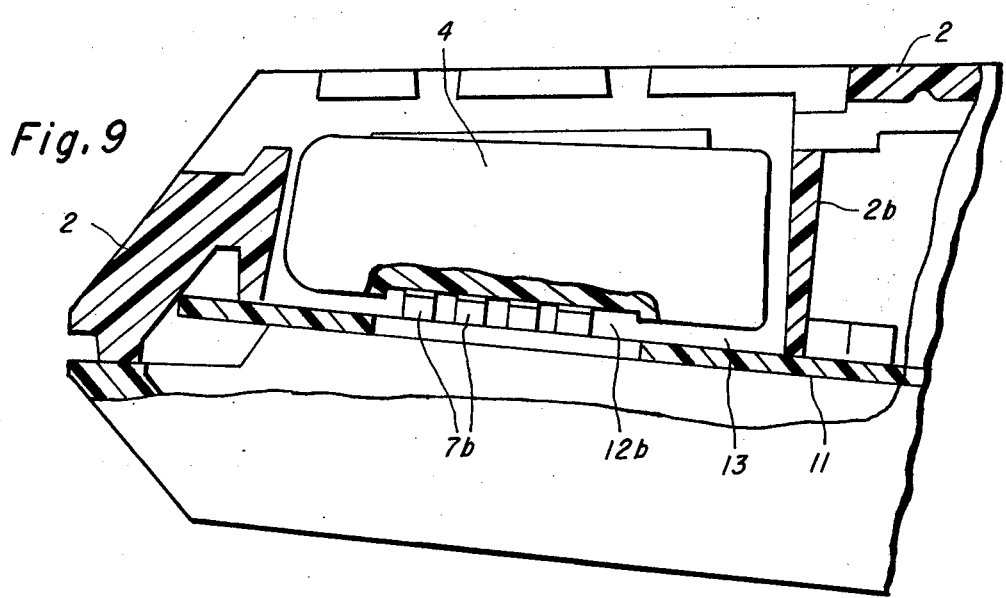
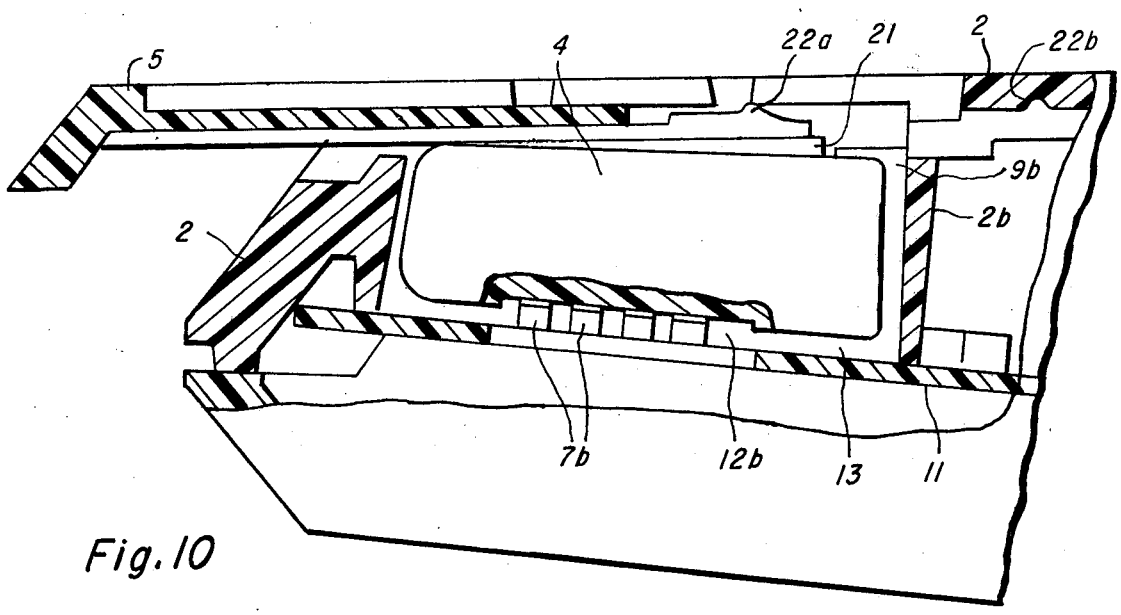

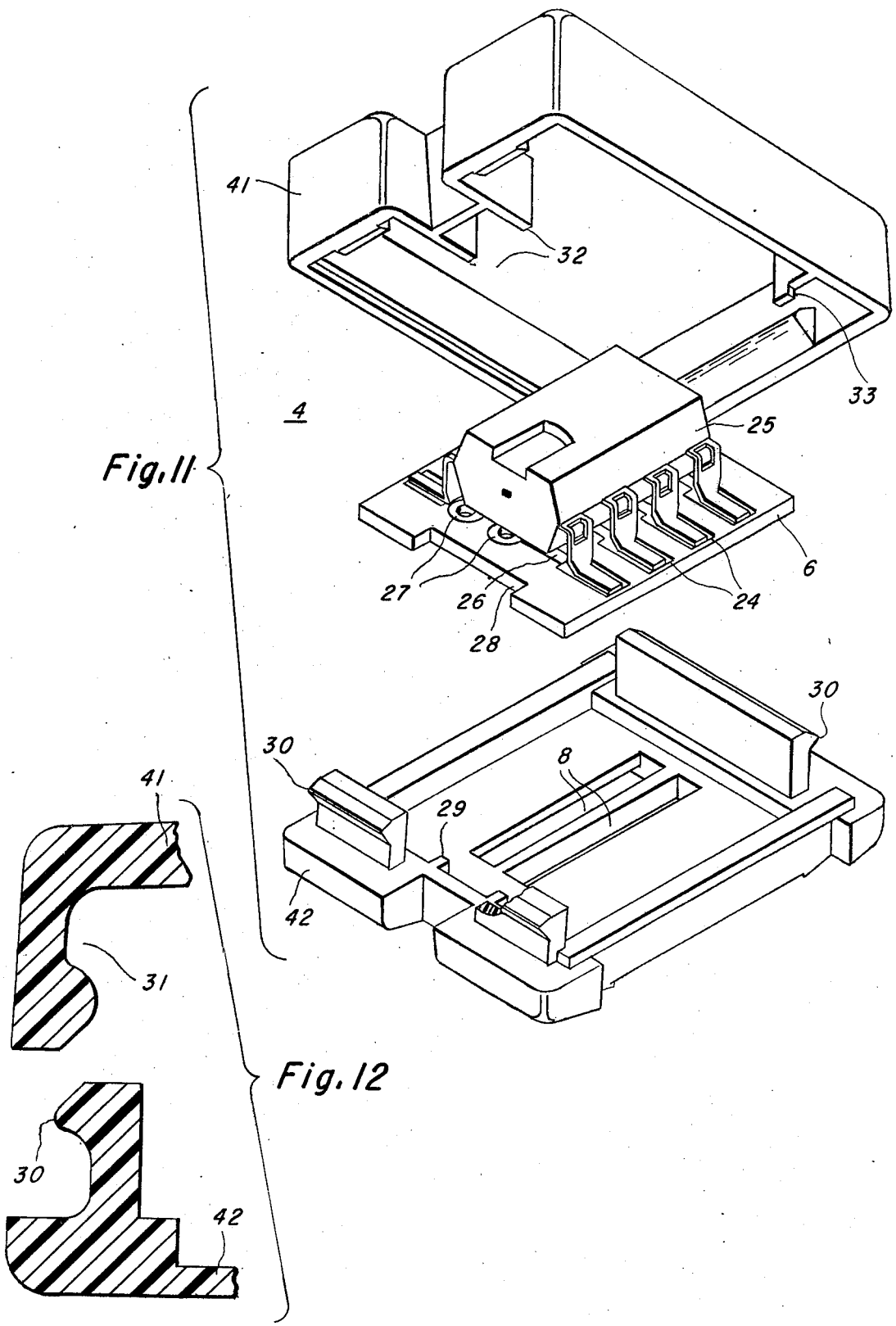

INTERCHANGEABLE MODULE FOR INTEGRATED CIRCUITS

This is a continuation of copending patent application Ser. No. 803,507, filed June 6, 1977, now U.S. Pat. No. 4,216,522.

BACKGROUND OF THE INVENTION

This invention relates to electronic packing of an integrated circuit in a module for interchangeably coupling the integrated circuit to an electronic apparatus. In the disclosed embodiment the apparatus is an electronic calculator and the integrated circuit stores calculator programs. However, the disclosed module may be used in a wide range of applications, including such applications as video games, personal computer systems and the like.

In the prior art it has been known to provide interchangeable electronic functions by permitting the end user of an apparatus to plug a selected integrated circuit mounted in a standard dual-in line package into a socket in some apparatus or by permitting the end user to plug an interchangeable printed circuit board card into a socket in the apparatus. These techniques are reasonably successful provided the end user is adequately trained and the change of integrated circuits is infrequently made. These techniques suffer from some faults if the changes are to be made frequently or if the general public is to make the changes. For instance, the leads from a dual-in-line package may be too easily broken when used in such applications. Also, it is difficult to assure that such an integrated circuit will be properly installed, with the correct orientation.

It was, therefore, one object of this invention that an integrated circuit be installed in a module which may be easily manufactured but also handled by the public without causing damage to the integrated circuit.

It was another object that the module be insertable in a receptacle or opening in the housing of some apparatus with a low risk of damaging either the module or its receptacle.

It was still another object that the module and receptacle may be subjected to frequent use with a low risk of damaging within the module or its receptacle.

It was yet another object that the module be installable in the receptacle only with the correct orientation, such that the integrated circuit is properly connected to the apparatus.

The foregoing objects are achieved as is now described. The integrated circuit is installed within a module which preferably has an essentially polyhedral shape and which is preferably made of plastic material. The integrated circuit is preferably packaged in a standard integrated circuit package, such as a dual-in-line package, before being installed within the module. The leads emanating from the integrated circuit package are attached to pads affixed to a substrate, which is also housed within the module. A plurality of contacts, coupled to the integrated circuit, are affixed to the substrate. Access to these contacts from the exterior of the module is provided by at least one aperture therein. The module is provided with a slot or key at one end for assuring the proper orientation thereof when the module is inserted in a receptacle, such as might be provided on a calculator or video game, for instance.

BRIEF DESCRIPTION OF THE DRAWINGS

The novel features believed characteristic of the invention are set forth in the appended claims. The invention itself, however, as well as further objects and advantages thereof, will be best understood by reference to the following detailed description of an illustrative embodiment, when read in conjunction with the drawings, wherein:

FIG. 2 is a partial pictorial view of the housing of an electronic calculator provided with an opening or receptacle for receiving a module containing an integrated circuit, such as a read-only-memory, for instance;

FIGS. 3a and 3b are top and bottom perspective views of the module;

FIG. 4 is a section view of the opening and a side view of a module being inserted therein;

FIG. 5 is a cut-away detailed perspective view of the opening in the housing;

FIG. 6 is a top view of the opening in the housing;

FIGS. 7 and 8 are detailed perspective views of the contacts located within the receptacle or opening;

FIG. 9 is a section view of the opening and a side view of a module setting within the receptacle;

FIG. 10 is a section view of the opening, a partially cut-away side/section view of a module setting therein and a side view of the receptacle cover in a partially closed position;

FIG. 11 is an exploded perspective view of the module body pieces, the integrated circuit and the substrate housed within the module, and FIG. 12 is a detailed cross section of the fastening snaps provided in the module body pieces.

DETAILED DESCRIPTION

Figure 1:
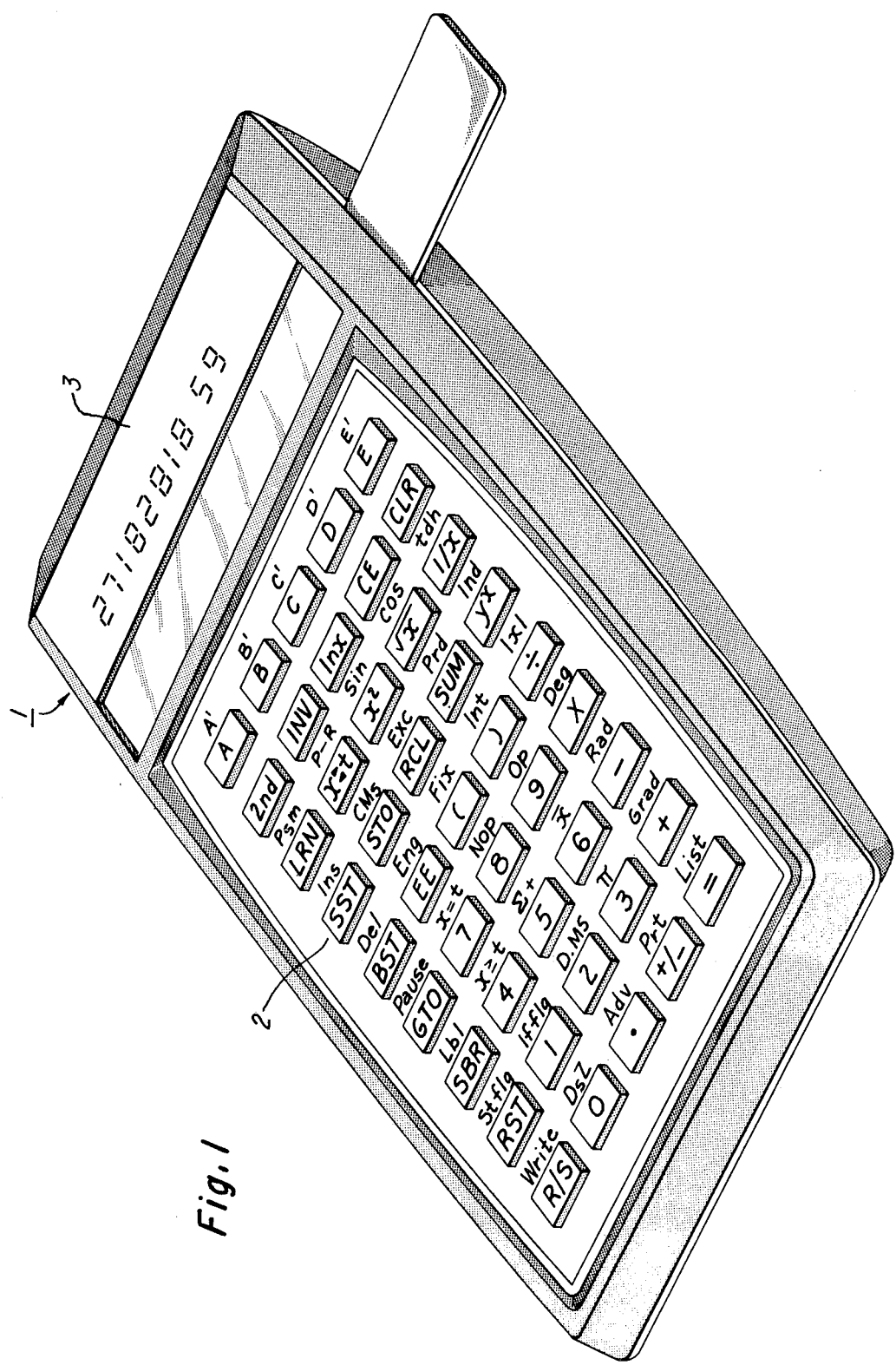
FIG. 1 is a pictorial view of an electronic calculator of the type which may embody the invention.

Referring now to FIG. 1, there is shown a calculator 1 of the type which may employ the present invention. The circuits which may be advantageously utilized in such a calculator are disclosed in U.S. Pat. No. 4,153,937. It is to be remembered, of course, that the present invention may also be advantageously utilized in other applications, including video games, and computing machines, wherein it is desired to provide an apparatus into which the user thereof may easily insert one or more integrated circuit devices.

In FIG. 2, there is shown the rear side of calculator 1. The calculator's case or housing 2 is provided with a receptacle or opening 3 for receiving a module 4. At least one integrated circuit 25 (FIG. 11) is disposed within module 4. A door or cover 5 is provided for retaining module 4 in place during use. While housing 2 is shown with one opening 3 for receiving one module 4 therein, it should be evident to those skilled in the art that housing 2 could be provided with a plurality of such openings and/or opening 3 could receive a plurality of such modules.

In FIGS. 3a and 3b, there are shown perspective top and bottoms views, respectively, of module 4. As will be seen with respect to FIG. 11, module 4 preferably encloses an integrated circuit 25 mounted on a substrate 6. The integrated circuit is coupled to contacts 7a which are formed on substrate 6. Substrate 6 and contacts 7a appear through apertures 8, as is shown in FIG. 3b. Module 4 is provided with a slot or key 9a at the front edge thereof which assures, in combination with member 9b in opening 3 (FIGS. 2 and 5), that module 4 cannot be installed backwards in opening 3.

When in place in opening 3, contacts 7a of module 4 mate with contacts 7b in opening 3 (FIG. 2). Contacts 7b, which are shown in greater detail in FIGS. 7 and 8, are preferably affixed to a substrate or printed circuit board 11 in housing 2; substrate 11 appears at the bottom of opening 3. Locating rails 12b, which are disposed near the bottom of opening 3 and along two sides thereof, position module 4 with respect to contacts 7b, when rails 12b mate with slots 12a (disposed along the corresponding edges of module 4) as module 4 is installed in opening 3.

Rails 12b and slots 12a preferably do not extend along the entire side of opening 3 and module 4, respectively, so that module 4 does not engage contacts 7b until module 4 is properly centered thereover. The portion, of module 4, denoted by numeral 13, at the end of slots 12a, rides on rails 12b when module 4 is inserted at an angle to opening 3 thereby protecting contacts 7b from the body of module 4. The action of portions 13 bearing on rails 12b can be seen in FIG. 4. FIG. 4 is a cut-away sectional view through housing 2 taken near a side of opening 3 in-way-of a rail 12b at Section B—B in FIG. 6.

FIG. 5 is a partially cut-away view of housing 2, showing opening 3 therein in greater detail. The housing 2 may be provided by molded plastic, for instance, and the walls 2b thereon may be molded therewith. The rails 12b are preferably provided by a plastic piece 2a which is not made integral with housing 2 to simplify the molding of housing 2.

In FIG. 6 there is shown a plane view of opening 3 in housing 2. Locating rails 12b and key 9b are shown, as well as the walls 2b of opening 3. Substrate 11, which may be provided by a printed circuit board disposed within housing 2, for instance, preferably provides a bottom for opening 3. Contacts 7b are preferably mounted on substrate 11 and extend over aperture 14 in substrate 11 to permit contacts 7b to deflect slightly when engaging contacts 7a on module 4.

Referring now to FIGS. 7 and 8, contacts 7b are depicted in detail. In FIG. 7, contact 7b is shown to be affixed by solder to pad 15 on substrate 11. Portion 18 of contacts 7b (FIG. 8) is inserted in opening 16 for locating purposes. A protuberance 17 on contact 7b provides the point of contact with contact 7a when module 4 is inserted in opening 3. The group of contacts 7b of FIG. 8 are preferably mounted as a unit on substrate 11 and portions 19 and 20 thereof are broken off after mounting along lines A and B. This helps to assure that contacts 7b are properly spaced on substrate 11.

The portions of contacts 7b affixed to substrate 11 create a slight protrusion in this area, so module 4 is provided with a slight indentation on the bottom thereof at numeral 23 in FIG. 3b to provide a clearance therefor.

FIG. 9 is a sectional view through opening 3 in housing 2 generally at Section A—A in FIG. 6 and a side view of module 4 being inserted therein. Of course, the depicted slot 12a appears in the foreground while the depicted rail 12b appears in the background, but it can be seen that rail 12b properly positions module 4 with respect to contacts 7b.

FIG. 10 is a similar section/side view as in FIG. 9, a partial sectional view of module 4 being added with a side view of cover 5 in a partially closed position. As cover 5 is pushed home, it bears on wedge-shaped ribs 21 (which are preferably inclined plain-shaped members) on the top of module 4, causing the contacts 7a of module 4 to firmly engage contacts 7b as module 4 is pushed towards contacts 2b. In FIG. 10, contacts 7a are shown as being affixed to substrate 6 in module 4 and are shown as engaging contacts 7b. Cover 5 and housing 2 are preferably provided with means 22a and 22b for temporarily securing cover 5 in a closed position.

An exploded view of module 4 is shown in FIG. 11. Integrated circuit 25, which in this embodiment is provided in a standard dual-in-line package, is affixed to substrate 6 by reflow soldering the leads thereof to pads 24 deposited on substrate 6. Contacts 7a are located on the reverse side of substrate 6 in this view and are coupled to pads 24 by conductors 26 deposited therebetween. In this embodiment, conductors 26 pass between the major surfaces of substrate 6 via holes 27. It should be evident to those skilled in the art that integrated circuit could alternatively be provided in flat packs, by tape mounted devices or be directly mounted on substrate 6 and wire bonded to conductors formed thereon.

The case for module 4 is preferably provided by two plastic pieces 41 and 42 which are provided with tabs 30 and recesses 31 for snapping pieces 41 and 42 together during the manufacture of module 4. When snapped together, pieces 41 and 42 provide a chamber in which substrate 6 and integrated circuit 25 is disposed. Tabs 30 and recesses 31 are more clearly shown in FIG. 12. The proper orientation of substrate 6 in the chamber in module 4 is assured by slot 28 on substrate 6 being keyed to projection 29 on piece 42. When substrate 6 is located in module 4, the contacts 7a affixed to substrate 6 coincide with openings 8 in piece 42, thus providing access for contacts 7b to engage contacts 7a. Substrate 6 is firmly held against piece 42 when installed in module 4 by the action of protuberances 32 and 33 in piece 41 bearing against substrate 6 when pieces 41 and 42 are snapped together.

The invention has been described in connection with a specific embodiment. It is to be understood that modification may now suggest itself to those skilled in the art and that this invention is not limited to the specific embodiment disclosed, except as set forth in the appended claims.

What is claimed is:

1. An interchangeable modular system for an electronic calculator or the like, comprising:
   (a) a module including:
   (i) an electronic device:
   (ii) at least one body member forming an essentially polyhedral housing for said module and providing a chamber therein for containing said electronic device, said body having first and second opposite exterior major surfaces;
   (iii) a plurality of contacts essentially located in a single plane and exposed to the exterior of said module via said first major surface, said plurality of contacts being electrically coupled to said electronic device within said chamber; and
   (iv) at least one inclined plane member extending outwardly from and along said second major surface of said body member for permitting biasing pressure to be exerted on said module in a direction parallel to said second major surface and in a direction perpendicular to said second major surface;
   (b) a receptacle located in said calculator for receiving said module; said receptacle including a second plurality of contacts adapted to electrically conductively engage the plurality of contacts located in said module when said module is installed in said receptacle;

(c) a receptacle cover for sealing said receptacle with said module located therein, said cover being engageable with said inclined plane member to ensure firm engagement of the contacts in said module with the contacts in said receptacle by exerting biasing pressure on said module in a direction parallel to said second major surface and in a direction perpendicular to said second major surface when said module is inserted in said receptacle and the receptacle cover is closed by pushing the cover along said inclined plane member in a direction parallel to a plane defined by the mouth of the receptacle; and (d) means adjacent said receptacle mouth for guiding said receptacle cover for movement in said plane defined by the mouth of the receptacle.

2. The system according to claim 1 further including a pair of inclined plane members positioned on opposite sides of said second major surface.

* * * * *